US009217782B2

(12) United States Patent
Bertrand

(10) Patent No.: US 9,217,782 B2
(45) Date of Patent: Dec. 22, 2015

(54) METHOD FOR MEASURING CURRENT IN AN ELECTRIC NETWORK

(71) Applicant: Smartfuture SAS, Pierrefeu du Var (FR)

(72) Inventor: Paul Bertrand, Pierrefeu du Var (FR)

(73) Assignee: SMARTFUTURE SAS, Pierrefeu du Var (FR)

(*) Notice: Subject to any disclaimer, the term of this patent is extended or adjusted under 35 U.S.C. 154(b) by 173 days.

(21) Appl. No.: 13/783,956

(22) Filed: Mar. 4, 2013

(65) Prior Publication Data

US 2013/0229173 A1  Sep. 5, 2013

(30) Foreign Application Priority Data

Mar. 5, 2012 (FR) ...................................... 12 51967

(51) Int. Cl.
G01R 33/028 (2006.01)
G01R 33/00 (2006.01)
G01R 15/20 (2006.01)
G01R 33/02 (2006.01)

(52) U.S. Cl.
CPC .......... *G01R 33/0017* (2013.01); *G01R 15/207* (2013.01); *G01R 33/0206* (2013.01); *G01R 33/028* (2013.01)

(58) Field of Classification Search
CPC ...................................................... G01R 35/04
See application file for complete search history.

(56) References Cited

U.S. PATENT DOCUMENTS

| 5,977,766 | A  | * | 11/1999 | Linder et al. ................... 324/225 |
| 6,304,082 | B1 |   | 10/2001 | Gualtieri et al. |
| 7,847,438 | B2 | * | 12/2010 | Jin et al. ......................... 307/104 |
| 8,189,311 | B2 | * | 5/2012  | Papallo et al. ................... 361/64 |
| 8,577,298 | B2 | * | 11/2013 | Parks et al. ................... 455/63.1 |
| 2008/0136408 | A1 | * | 6/2008 | Andra et al. ................... 324/239 |
| 2012/0068692 | A1 | * | 3/2012 | Patel et al. ..................... 324/202 |

FOREIGN PATENT DOCUMENTS

| WO | 0150142 A1    | 7/2001 |
| WO | 2008042483 A1 | 4/2008 |
| WO | 2012003492 A2 | 1/2012 |

OTHER PUBLICATIONS

Search Report issued Nov. 27, 2012 in FR Application No. 1251967.

* cited by examiner

*Primary Examiner* — Tung X Nguyen
*Assistant Examiner* — Feba Pothen
(74) *Attorney, Agent, or Firm* — Panitch Schwarze Belisario & Nadel LLP

(57) ABSTRACT

A method for measuring current in an electric network comprising at least one first electric line. The method includes fitting the first line with a circuit breaker having a protection coil and having a wall traversed by a magnetic field emitted by the protection coil; arranging on the wall of the circuit breaker a synchronous three-axis digital magnetometer on a semiconductor chip; by way of the digital magnetometer, measuring at least one component of a magnetic field emitted by the coil; and determining the value of a current traversing the electric line from the measured component.

11 Claims, 3 Drawing Sheets

METHOD FOR MEASURING CURRENT IN AN ELECTRIC NETWORK

BACKGROUND OF THE INVENTION

Embodiments of the present invention relate to a method for measuring current in an electric network. Measuring the current consumption in an electric network enables an energy diagnosis to be made. By offering the user the possibility of monitoring its current consumption item by item, called "electrical use", significant savings can be made.

New thermal regulations encourage the use of current consumption measuring devices in service and residential buildings, by providing, in each electric board, for the estimation and the display of the consumption of the various connected appliances (heating, cooling, hot water production, lighting, cooking, sockets, and the like).

Several methods for estimating electrical use are known. Certain methods involve a direct measurement by installing an electrical use submeter in the electric board, while others involve an indirect measurement by analyzing the global load curve on the network, and correlating it with usage parameters of the various appliances connected.

Indirect methods provide an estimation of the use by analyzing the load curve at the input point of the electric board. Their scope of application is reduced and is limited to loads that switch only a few times a day. A correlation-based estimation algorithm is used that is unreliable when the loads have a current consumption that varies continuously, for example an air conditioner, a heat pump, or a variable drive motor, or that switch very often with time intervals of a few seconds. These methods are thus difficult to apply to the service sector or retail outlets.

The methods involving a direct measurement require installing sub-metering modules in the electric board, each comprising a current sensor and which must be arranged in series with the protection circuit breakers. Circuit breakers integrating devices for measuring current have also been suggested.

The methods involving a direct measurement are difficult to implement and expensive when they must be implemented in an existing installation. In this case, it is necessary to change the wiring of the electric board, or even to change the board to enable the sub-metering modules or new circuit breakers to be installed. The installation cost then greatly exceeds the savings to be made for private individuals, a small store, or a small service building. This method is thus rarely implemented.

To reduce the cost price of the metering modules, circuit breakers equipped with a current sensor with a microelectromechanical system (MEMS), as described for example in International Patent Publication No. WO 2008 042 483, have been suggested. However, conventional circuit breakers are generally preferred due to their low cost price. Moreover, circuit breakers equipped with current sensors are intended for the new property market and do not find any opening in existing buildings due to their high purchase and installation costs.

International Patent Publication No. WO 01/50142 also describes metering modules based on MEMS sensors that are arranged around electric wires. These sensors must be linked to an electronic measurement circuit and the global cost price is high.

Therefore, it could be desirable to provide a method for measuring current in an electric network that has a low cost price and is easy to adapt to an existing electric installation, without the need to replace its components.

BRIEF SUMMARY OF THE INVENTION

Some embodiments of the present invention relate to a method for measuring current in an electric network having at least one first electric line, including linking the first electric line to a first circuit breaker having a first protection coil and having a wall traversed by a magnetic field emitted by the coil; arranging, on the wall of the first circuit breaker, a first synchronous three-axis digital magnetometer on a semiconductor chip; measuring, by way of the first digital magnetometer, at least one component of the magnetic field emitted by the first coil; and determining the value of a current traversing the electric line from the measured component.

According to one embodiment, the method includes arranging a magnetic shield around the magnetometer to limit the influence on the magnetometer of a magnetic field emitted by a neighboring circuit breaker.

According to one embodiment, the method includes linking at least one second electric line to a second circuit breaker having a second protection coil having a wall traversed by a magnetic field emitted by the second coil; arranging, on the wall of the second circuit breaker, a second synchronous three-axis digital magnetometer on a semiconductor chip; measuring, by way of the second magnetometer, at least one component of a magnetic field emitted by the first coil; correcting the components measured by each magnetometer by subtracting from each component a fraction of the component measured by the other magnetometer, so as to neutralize a phenomenon of magnetic interference between the two circuit breakers; and determining the value of a current traversing each electric line from the corrected components.

According to one embodiment, the correction step includes determining, for each circuit breaker, an interference parameter of the circuit breaker on a magnetometer associated with another circuit breaker, representative of a variation in the magnetic field detected by the magnetometer associated with the other circuit breaker, when the magnetic field emitted by the circuit breaker varies.

According to one embodiment, the method includes determining an interference matrix including all the interference parameters, determining an inverse matrix of the interference matrix, and correcting the components measured from the inverse interference matrix.

According to one embodiment, the step of determining the interference parameter includes: sampling in a synchronous manner, at two successive times, a component of the magnetic field measured by the first magnetometer and a component of the magnetic field measured by the second magnetometer; determining a variation in the first component and a variation in the second component; and determining the interference parameter of a circuit breaker on the magnetometer associated with the other circuit breaker by dividing the smallest of the two variations in absolute value by the highest of the two variations in absolute value.

According to one embodiment, the method includes calibrating each magnetometer to associate a value of current circulating in the corresponding electric line with a measured alternating magnetic field value.

According to one embodiment, the measurement of a component of a magnetic field emitted by the coil of a circuit breaker includes removing a DC offset of terrestrial magnetic field.

Some embodiments of the present invention also relate to a device for measuring current in an electric network, including at least one first circuit breaker linked to a first electric line, the circuit breaker including a first protection coil and having a wall traversed by a magnetic field emitted by the coil; a first synchronous three-axis digital magnetometer on a semiconductor chip, arranged on the wall of the first circuit breaker; and a monitoring and processing circuit, for measuring by way of the first magnetometer at least one component of the magnetic field emitted by the first coil, and determining the value of a current traversing the electric line from the measured component.

According to one embodiment, the device includes a magnetic shield arranged around the magnetometer to limit the influence on the magnetometer of a magnetic field emitted by a neighboring circuit breaker.

According to one embodiment, the device includes at least one second circuit breaker linked to a second electric line, the circuit breaker comprising a second protection coil and having a wall traversed by a magnetic field emitted by the second coil, a second synchronous three-axis digital magnetometer on a semiconductor chip, arranged on the wall of the second circuit breaker, and linked to the monitoring and processing circuit, the monitoring and processing circuit being configured to correct the components measured by each magnetometer by subtracting from each component a fraction of the component measured by the other magnetometer, so as to neutralize a phenomenon of magnetic interference between the two circuit breakers, and to determine the value of a current traversing each electric line from the corrected components.

According to one embodiment, the monitoring and processing circuit is configured to determine, for each circuit breaker, an interference parameter of the circuit breaker on a magnetometer associated with another circuit breaker, representative of a variation in the magnetic field detected by the magnetometer associated with the other circuit breaker, when the magnetic field emitted by the circuit breaker varies.

According to one embodiment, the monitoring and processing circuit is configured to sample in a synchronous manner, at two successive times, a component of the magnetic field measured by the first magnetometer and a component of the magnetic field measured by the second magnetometer, determine a variation in the first component and a variation in the second component, and determine the interference parameter of a circuit breaker on the magnetometer associated with the other circuit breaker by dividing the smallest of the two variations in absolute value by the highest of the two variations in absolute value.

According to one embodiment, the device includes a measurement module having a housing configured to be arranged on the wall of a circuit breaker, an interconnect carrier receiving a magnetometer, and apparatus configured to electrically couple the magnetometer to at least one other magnetometer arranged in another measurement module.

Some embodiments of the present invention also relate to a system for managing current consumption in an electric network having electric lines, including a measuring device according to the present invention, and a remote management device configured to store values of current supplied by the measuring device.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

The present invention includes the observation that commercially available three-axis digital magnetometers can be found that are designed to measure the terrestrial magnetic field and are intended for the cellular telephone market, for applications such as compass software, metal detectors, pure silver analyzer, and the like.

These magnetometers based on MEMS are integrated onto a semiconductor chip and have, in addition to terrestrial magnetic field sensors, a measuring and control circuit, and a communication interface circuit capable of dialoging with an external controller through a data bus.

Due to the huge quantities marketed, these magnetometers have a very low cost price that is much lower than that of a magnetic field detector and its associated electronic measurement circuit, of the type mounted in electric boards to measure a current.

In addition, such magnetometers can perform synchronous measurements thanks to a synchronization input that can receive an external synchronization signal.

Figure 1:
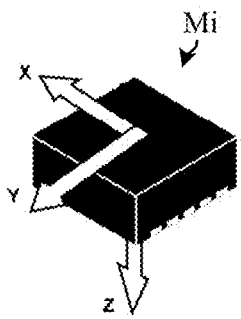
FIG. 1 shows a commercially available three-axis digital magnetometer.
Figure 2:
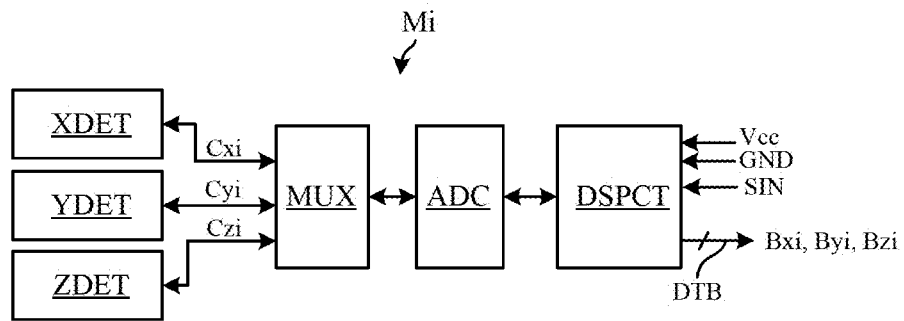
FIG. 2 shows the structure of the magnetometer of FIG. 1.

As an example, FIG. 1 represents the housing of such a three-axis digital magnetometer Mi and FIG. 2 represents the wiring diagram of the magnetometer Mi. For example, this is the magnetometer marketed by the company Freescale under the reference MAG3110. The housing has a small surface area, typically of the order of 3 mm×3 mm.

The magnetometer Mi is capable of measuring a magnetic field with a frequency of up to 80 Hz, corresponding to a sampling interval of approximately 12 ms. The magnetometer Mi includes a detection stage equipped with three sensors XDET, YDET, and ZDET configured to measure the terrestrial magnetic field according to three orthogonal axes X, Y, and Z and to provide analog measurement signals $Cx_i$, $Cy_i$, $Cz_i$. The magnetometer Mi further includes a multiplexer MUX linking the sensors to an analog-digital converter ADC, the output of which supplies digitized sensor signals $DC_x$, $DC_y$, $DC_z$ to a monitoring and processing circuit DSPCT. The circuit DSPCT is configured to supply, through an output compatible with a data bus DTB (for example a 2-wire I2C bus in the case of the magnetometer MAG3110), magnetic field components $Bx_i$, $By_i$, $Bz_i$. The circuit DSPCT also includes a synchronization input SIN (for example the contact INT1 in the documentation of the magnetometer MAG3110). The circuit DSPCT further includes power supply contacts Vcc and GND (ground) and various other contacts that will not be detailed here.

Such a magnetometer, due to its packaging in the form of a micro-housing and the applications for which it has been designed, is conventionally deemed unsuitable for measuring current in an electric line. In particular, studies have shown that its sensitivity is not sufficient for a reliable measurement of the magnetic field near an electric wire subjected to a medium intensity current representative of the current consumption in a branch of a domestic electric network.

However, it may be noted that its maximum 80 Hz measurement frequency makes it suitable for sampling, in a synchronous manner, an oscillating alternating magnetic field, in particular a field oscillating at 50 Hz or 60 Hz generated by an AC current of the electric network. Such sampling will not be compliant with the Nyquist-Shannon theorem, which can lead to an error in the estimated value of the signal oscillating at 50 or 60 Hz. Such an error can however be tolerated in the framework of the estimation of the current traversing an electric line, which does not require any metrological accuracy. Furthermore, a magnetometer of the above-mentioned type but having a higher sampling frequency is likely to be commercially available in the future, and could then be chosen for the implementation of the present invention.

Figure 3:
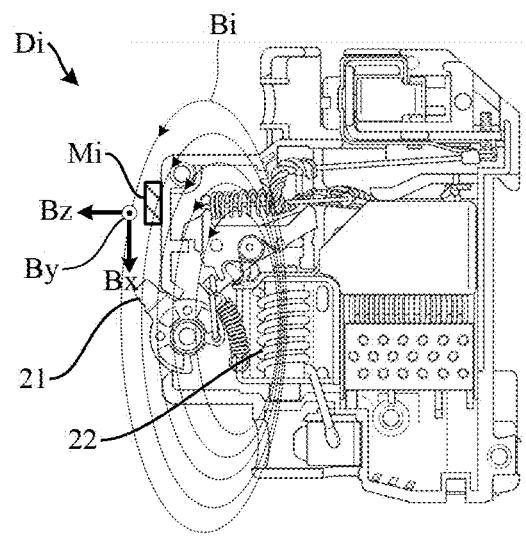
FIG. 3 is a cross-sectional view of a conventional circuit breaker equipped with the magnetometer.

The present invention also includes the observation that, in present-day electric boards, thermal magnetic circuit breakers are generally used instead of conventional fuses. FIG. 3 represents the conventional structure of a thermal magnetic circuit breaker Di. The circuit breaker includes a reset lever 21, a thermal cut-off unit, and a magnetic cut-off unit. These units are known and will not be described in detail here. The magnetic cut-off unit includes a solenoid, or protection coil 22. Once mounted on an electric board, the circuit breaker Di is traversed by the same current as that traversing the line to be monitored, and this current also traverses the protection coil 22.

The protection coil 22 generates a magnetic field Bi proportional to the current traversing it. When the electric line downstream from the circuit breaker experiences a short-circuit, the current exceeds a certain threshold and the magnetic field then becomes sufficient to trigger the circuit breaker.

Studies have been done on a set of circuit breakers marketed under various brand names. A map of the magnetic field emitted by the circuit breakers has been traced for each circuit breaker. It has been discovered that all the circuit breakers studied have a wall that is traversed by a magnetic field and that has a point of concentration of the field, where the latter is more intense than at any other point of the circuit breaker accessible from the outside. This wall is generally the front face of the circuit breakers, and the point of concentration is generally located near the reset lever 21. This front face is generally referred to as "small face" because the circuit breakers generally have a housing including a small front part and a larger rear part, the face in question being the front face of the front part of the housing, as shown in FIG. 3.

These studies also show that the magnetic field Bi in the concentration zone generally includes a dominant component. With certain models, it is the component Bzi according to a Z-axis perpendicular to the plane of the front face of the circuit breaker, the components Bxi and Byi, according to axes X and Y parallel to the front face, being weaker. It is deduced therefrom that this magnetic field concentration, and more particularly the presence of a dominant component, is due to the presence of the protection coil.

Therefore, according to one aspect of the present invention, a three-axis digital magnetometer Mi of the above mentioned type is arranged on the front face of the circuit breaker Di. The magnetometer Mi can be used as-is, i.e., as sold, integrated into a small housing, or can be used as a bare semiconductor chip that is mounted into a measurement module described below. The magnetometer Mi is used to detect at least one component of the magnetic field present on the front face of the circuit breaker, preferably the dominant component, for example Bzi, and optionally the other components Bxi, Byi of this field.

Figure 4:
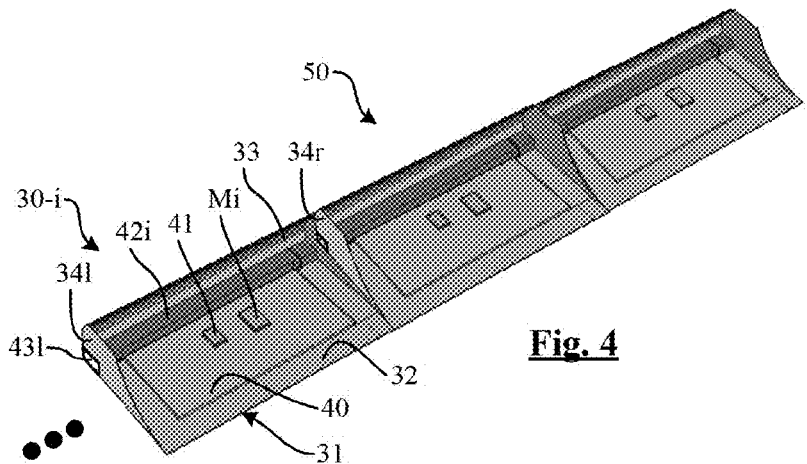
FIG. 4 shows modules for measuring current according to an embodiment of the present invention.

FIG. 4 represents a device 50 for measuring current according to an embodiment of the present invention. The device 50 includes a plurality of identical measurement modules 30-1, arranged side by side. Each module 30-1 includes an open housing 31 including a base 32, a cover 33 extending in line with the base 32 and partially covering the latter, a left side wall 34l and a right side wall 34r. A printed circuit 40 is arranged on the base 32. The printed circuit 40 receives a three-axis digital magnetometer Mi of the type described above, the contacts of the housing of the magnetometer being welded onto contact pads of the printed circuit (not represented). Alternatively, the magnetometer Mi may be a "bare chip" mounted on the printed circuit. The printed circuit also receives auxiliary electronic components schematically represented in the form of a block 41, for example capacitors and resistors.

Each module 30-1 includes transversal conductive paths 42-$i$, produced for example on the printed circuit 40. These transversal paths are covered by a protection cover in the example represented. The magnetometer Mi is electrically linked to the transversal conductive paths 42-$i$ through intermediate conductive paths of the printed circuit (not represented). The transversal conductive paths 42-$i$ are electrically linked to a left connector 43l and to a right connector (not represented) of the module 30-1. The left connector 43l passes through the left side wall 34l and the right connector passes through the right side wall 34r. Each connector 43l cooperates or can cooperate electrically with the corresponding connector of an adjacent module 30-(i+1) or 30-(i−1), so that the transversal conductive paths 42-$i$ of the different modules are interconnected and form, together, a data and supply bus 42 to which all the magnetometers Mi are linked.

Figure 5A:
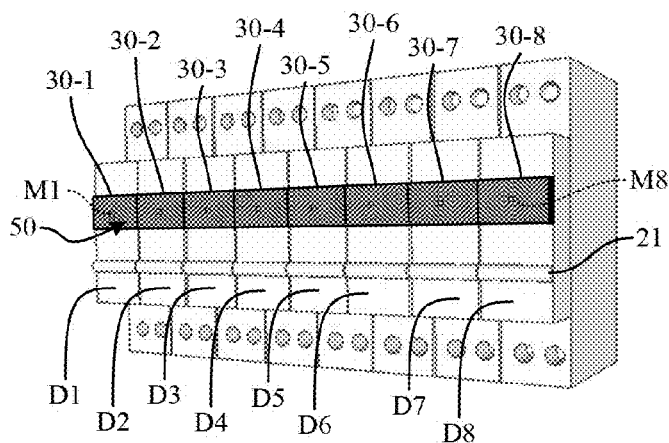
FIGS. 5A, 5B are perspective and side views of a set of circuit breakers receiving the modules for measuring current.
Figure 5B:
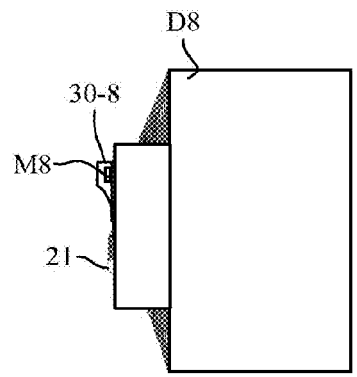

FIGS. 5A and 5B respectively represent, by a perspective and side view, an arrangement of the device for measuring current 50 on a set of eight thermal magnetic circuit breakers D1 to D8 arranged side by side, which control the various branches of an electric network. The device 50 here includes eight modules 30-$i$ (30-1 to 30-8) each including a magnetometer Mi, i.e., eight magnetometers M1 to M8 in total. As shown in FIG. 5B, the rear face of the base of each module 30-$i$ is fixed onto the front face ("small face") of the corresponding circuit breaker Di, here above the reset lever 21, for example by way of a double-sided adhesive tape. Each circuit breaker Di is thus associated with a magnetometer Mi, which enables the magnetic field emitted by the coil of the circuit breaker to be measured.

The open shape of the housing of each module M1 is provided here to allow a finger to be inserted above the printed circuit in order to reset a circuit breaker, the modules 30-$i$ being arranged above the reset lever 21. In this case, the lever 21, represented in FIG. 5B in the low position, is instead in a high position and extends over the printed circuit of the module M1 (M8).

Figure 6:
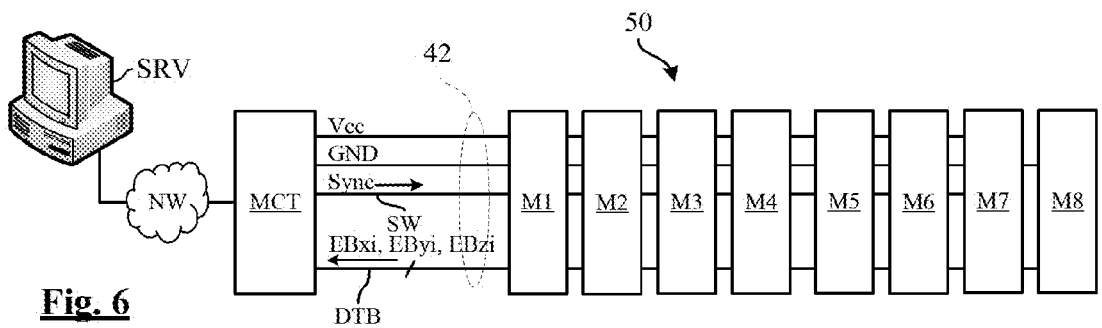
FIG. 6 is the wiring diagram of a device for measuring current including the measurement modules.

FIG. 6 is a block diagram of the electric architecture of the device 50. The eight magnetometers M1 to M8 interconnected by the data and supply bus 42 can be distinguished. The bus 42 includes a data bus DTB including a clock wire, a synchronization wire SW, and ground GND and supply Vcc wires. The synchronization wire SW enables a synchronization signal Sync to be applied to the magnetometers, to trigger the simultaneous measurement of the magnetic fields emitted by the circuit breakers. The bus 42 enables sampled components EBxi, EByi, EBzi of the magnetic fields measured by the magnetometers Mi to be conveyed.

The device 50 is linked through the bus 42 to a measuring and control circuit MCT, such as a microcontroller. The circuit MCT can be housed in one of the control modules 30-i of the device 50 (FIG. 4), which then forms both a measurement module and a module for controlling the other modules ("master module"). Alternatively, a specific control module equipped with the circuit MCT can be provided. The control module is arranged at any point of the electric board and is connected to the device 50 through the left connector 43l of the first module 30-1 or the right connector of the last module 30-8.

The circuit MCT supplies the synchronization signal Sync and receives samples of at least one component of the magnetic fields measured by the magnetometers Mi, for example samples EBzi of the component Bzi. It can also receive and process samples EBxi, EByi of the components Bxi, Byi, if a higher measurement accuracy is sought.

The circuit MCT processes the samples EBzi, or the samples of the components Bxi, Byi, Bzi, to remove therefrom a DC offset due to the terrestrial magnetic field and to calculate their root-mean-square value. The DC offset is removed by calculating the mean value of all the samples over N samples, and by subtracting this mean value from the value of each sample. The root-mean-square value of the components, or RMS value, is then determined by the circuit MCT by calculating the square root of the sum of the samples squared divided by the number N1 of samples, according to the classic formula: $\sqrt{[(1/N1)(\Sigma EBzi)]}$. Simplifying algorithms known per se can be used to do this RMS value calculation in a simple manner, saving computing or memory resources.

Below, "Bxi", "Byi", "Bzi" designate the RMS values of the components bearing the same references, calculated as indicated above. "Component" will mean this RMS value, calculated at a given time from several samples. This RMS value is regularly recalculated to obtain several values of the component and to monitor its changes over time for the implementation of the steps described below.

The circuit MCT then applies to the component Bzi thus calculated, or to the components Bxi, Byi, Bzi thus calculated, a processing step aiming to neutralize the effects of a magnetic interference phenomenon between the circuit breakers. This processing step enables the corrected component CBzi, or a group of corrected components CBxi, CByi, CBzi to be obtained.

The circuit MCT is also configured to transform each corrected component CBzi, or each group of corrected components CBxi, CByi, CBzi, into a value of current circulating in the circuit breaker D1 associated with the considered magnetometer Mi, i.e., the value of the current circulating in the branch of the electric network protected by the circuit breaker.

The transformation of a corrected component CBzi into a current value is done by way of conversion parameters stored by the circuit MCT, determined during a calibration phase. This calibration phase includes for example, for each circuit breaker:

opening all the circuit breakers except the one that must be calibrated, which is left in the ON state, measuring the current in the electric line protected by the circuit breaker, by any conventional method, or of estimating this current by connecting the line to an electric charge of which the consumption is known, measuring the component Bzi of the corresponding magnetic field, by way of the corresponding magnetometer Mi, and storing the measured current I and the component Bzi, or the ratio I/Bzi between the measured current and the component Bzi.

These calibration steps can be repeated with several current values for greater accuracy. If the circuit MCT also uses the components Bxi, Byi to measure the current, a similar calibration step is applied thereto. The circuit MCT then obtains three current values from each component, and calculates the mean of these values to determine the current value, or calculates the module of the magnetic field vector associated with these three components to deduce the current value.

Furthermore, the circuit MCT includes communication circuitry, for example a Wifi-type wireless communication interface, to establish a communication with a central device SRV for managing the current consumption. The central device SRV is for example a server or a PC. The central device SRV can be dedicated to the management of the considered electric network, or to a set of electric networks equipped with a measuring device 50 according to an embodiment of the present invention. The communication between the circuit MCT and the central device SRV is made through a computer network SW such as the Internet. The central device SRV manages a database that contains the current consumption of each line of the electric network and preferably, of the appliances connected thereto.

Aspects of the present invention relating to the neutralization of the magnetic interference effect between the circuit breakers will now be explained. For the sake of simplicity, only the removal of the interferences in the component Bzi will be considered, the explanation below being applicable to the other two components when they are used by the circuit MCT.

Figure 7:
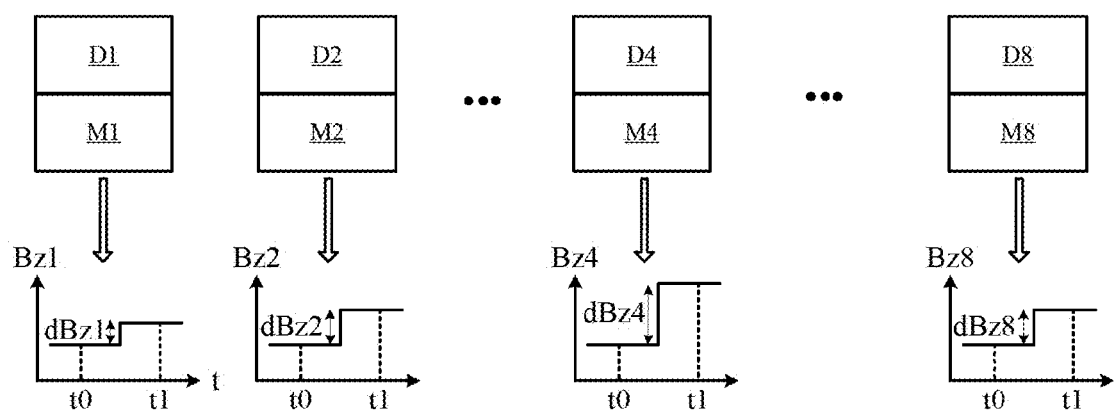
FIG. 7 shows a step of a method for correcting interference according to an embodiment of the present invention.

As shown schematically in FIG. 7, the row of eight circuit breakers D1 to D8 of the device 50 will be considered as an example, each circuit breaker being equipped with a magnetometer Mi (M1 to M8). Each circuit breaker Di creates a magnetic field that is governed by the Biot-Savart Law and extends over a certain distance, with a decrease of 1/d in the three detection directions, "d" being the distance relative to the coil of the circuit breaker. At a given time t0, upon receiving the synchronization signal Sync sent by the circuit MCT, each magnetometer Mi supplies the component Bzi of the magnetic field emitted by the corresponding circuit breaker Di. This component Bzi is marred by an error caused by the addition of the magnetic fields emitted by the neighboring circuit breakers, if they are traversed by current, and it is therefore no longer proportional only to the current traversing the circuit breaker Di.

Those skilled in the art can define methods or algorithms to subtract the interference effects from the component Bzi. One method involves for example a calibration before commissioning the device: for each circuit breaker Di, for a whole range of current values, the interference produced by the circuit breaker Di on all the neighboring circuit breakers is systematically measured. A database is thus formed that is supplied to the circuit MCT and used thereby to correct the components Bzi supplied by the magnetometers Mi.

According to an optional aspect of the present invention, the circuit MCT performs a method for removing interferences by a learning process, wherein no calibration is required. This method includes a learning phase and an exploitation phase.

Learning Phase:

i) the circuit MCT measures the components Bzi (Bz1 to Bz8) at two times t0 and t1, and calculates the variation dBzi=Bzi(t1)−Bzi(t0) of each component Bzi.

ii) the circuit MCT searches for the highest variation dBzi in absolute value. It is for example dBz4 in the example shown in FIG. 7.

iii) the circuit MCT attributes the origin of the variation of each component Bzi to a variation in current in the circuit breaker that has the highest variation in its magnetic field, here the circuit breaker D4, and thus assumes that the current did not vary in the other circuit breakers (this step is implicit and underlies the step iv below).

iv) the circuit MCT calculates, for the circuit breaker D4, an interference parameter $P_{i,4}$ that represents the influence of the circuit breaker D4 on the magnetometers Mi associated with the other circuit breakers, with:

$$P_{i,4}=dBzi/dBz4$$

For the magnetometer M4, this parameter is thus equal to 1.

v) the circuit MCT repeats steps i to iv as the current varies in the various circuit breakers, until an interference parameter Pi,j is obtained for each circuit breaker of rank j on each magnetometer of rank i, that is:

$$Pi,j=dBzi/dBzj$$

with i ranging here from 1 to 8 and j ranging from 1 to 8. As above, each calculation is based on the detection of the highest variation measured dBz in absolute value. Each interference parameter Pi,j can be calculated several times and then averaged to obtain a more accurate value.

vi) At the end of the learning phase, the circuit MCT obtains a set of interference vectors VINTi. Each interference vector VINTi is associated with a circuit breaker Di and includes the interference parameters of this circuit breaker on the magnetometers associated with the other circuit breakers. For example, for the circuit breaker D4, the interference vector VINT4 is equal to:

$$VINT4=\{dBz1/dBz4, dBz2/dBz4, dBz3/dBz4, 1, dBz5/dBz4, dBz6/dBz4, dBz7/dBz4, dBz8/dBz4\}$$

that is:

$$VINT4=\{P_{1,4}, P_{2,4}, P_{3,4}, 1, P_{5,4}, P_{6,4}, P_{7,4}, P_{8,4}\}$$

The circuit MCT then determines the interference matrix "MINT" shown below, by associating an interference vector VINTi with each column of the matrix. The vector VINT1 forms the first column of the matrix, the vector VINT2 the second column, and the like.

Matrix MINT:

| 1 | dBz1/dBz2 | dBz1/dBz3 | dBz1/dBz4 | dBz1/dBz5 | dBz1/dBz6 | dBz1/dBz7 | dBz1/dBz8 |
|---|---|---|---|---|---|---|---|
| dBz2/dBz1 | 1 | dBz2/dBz3 | dBz2/dBz4 | dBz2/dBz5 | dBz2/dBz6 | dBz2/dBz7 | dBz2/dBz8 |
| dBz3/dBz1 | dBz3/dBz2 | 1 | dBz3/dBz4 | dBz3/dBz5 | dBz3/dBz6 | dBz3/dBz7 | dBz3/dBz8 |
| dBz4/dBz1 | dBz4/dBz2 | dBz4/dBz3 | 1 | dBz4/dBz5 | dBz4/dBz6 | dBz4/dBz7 | dBz4/dBz8 |
| dBz5/dBz1 | dBz5/dBz2 | dBz5/dBz3 | dBz5/dBz4 | 1 | dBz5/dBz6 | dBz5/dBz7 | dBz5/dBz8 |
| dBz6/dBz1 | dBz6/dBz2 | dBz6/dBz3 | dBz6/dBz4 | dBz6/dBz5 | 1 | dBz6/dBz7 | dBz6/dBz8 |
| dBz7/dBz1 | dBz7/dBz2 | dBz7/dBz3 | dBz7/dBz4 | dBz7/dBz5 | dBz7/dBz6 | 1 | dBz7/dBz8 |
| dBz8/dBz1 | dBz8/dBz2 | dBz8/dBz3 | dBz8/dBz4 | dBz8/dBz5 | dBz8/dBz6 | dBz8/dBz7 | 1 |

The matrix MINT obtained during the learning phase may be imperfect. The learning can therefore continue during the exploitation phase in order to refine the interference parameters. Thus, the learning phase can be superimposed with the exploitation phase. A criterion for stopping the learning phase can be provided, for example when each of the interference parameters calculated is stabilized in the vicinity of a mean value.

Exploitation Phase:

The exploitation phase is based on the following reasoning:

1) Let M be a vector of the true magnetic measurements, i.e., those marred by interferences, including all the components Bzi:

$$M=\{Bz1, Bz2, Bz3, Bz4, Bz5, Bz6, Bz7, Bz8\}$$

2) Let S be a vector of magnetic measurements without interference, including components CBzi that would be measured if there were no interference:

$$S=\{CBz1, CBz2, CBz3, CBz4, CBz5, CBz6, CBz7, CBz8\}$$

The following can be written:

$$M=MINT \times S$$

For this purpose, it is assumed that the matrix MINT depends only on the topology of the circuit breakers and not on the currents circulating therein. Those skilled in the art will recognize in this hypothesis the fact that the fields are not coupled from one circuit breaker to another. This hypothesis has been verified by laboratory measurements.

In other terms, the vector of the true magnetic measurements M is equal to the product of the vector of the magnetic measurements without interference S and the interference matrix MINT. This means that each component Bzi measured on a circuit breaker Di is equal to the component without interference CBzi of the circuit breaker to which the sum of the interferences is added, i.e., the sum of the products of each interference parameter dBzi/dBzj and the values of the corresponding component without interference CBzj measured on another circuit breaker, i.e., for example:

$$Bz1=CBz1+CBz2*dBz1/dBz2+CBz3*dBz1/dBz3+\\CBz4*dBz1/dBz4+CBz5*dBz1/dBz5+\\CBz6*dBz1/dBz6+CBz7*dBz1/dBz7+\\CBz8*dBz1/dBz8$$

It is thus possible to write:

$$S=MINT^{-1} \times M$$

$MINT^{-1}$ being the inverse matrix of M.

Thus, during the exploitation phase, the circuit MCT calculates the inverse matrix $MINT^{-1}$ and uses it to transform a vector of true magnetic measurements M into a vector of magnetic measurements without interference S. The calculation of the vector S supplies the circuit MCT with the corrected values CBzi of the measured components Bzi, from which it deduces the value of the current traversing each circuit breaker.

As the matrix MINT can be poorly conditioned, its inversion can be calculated by using methods such as the method of pseudo-inverses, or even methods of SVD type ("Singular Value Decomposition") which obtain an accurate or approximate value of the inverse matrix $MINT^{-1}$. "Poorly conditioned" means the matrix may be marred by measurement uncertainties. In this case, the calculation of the inverse matrix can reveal very low value ratios producing random values. The SVD method, for example, involves setting the low values to 0 and forming a pseudo-inverse matrix that takes into account the zero values, this method being well known to those skilled in the art.

It will also be understood by those skilled in the art that the calculation of the vector S by way of the inverse matrix MINT$^{-1}$ is capable of being performed using various other mathematical methods or calculation algorithms, the matrix merely being a mathematical tool. For example, a method using neuronal algorithms could be implemented.

This calculation can be used to subtract, from each measured component Bzi, the sum of the products of the other components Bzi by their respective interference parameters, to obtain the corrected component CBzi. Indeed, if the terms of the inverse matrix are designated $C_{i,j}$, it can be written that:

$$CBzi \; \Sigma_{(j=1 \to N2)} C_{i,j} * Bzj$$

with j ranging from 1 to N2, N2 being the number of circuit breakers, and i the rank of the circuit breaker considered.

Thus, the corrected components CBzi are each obtained as a linear combination of the measured components Bzj, for j varying from 1 to N2. The coefficients of these linear combinations are generally negative for fields that always have the same orientation, except in the event that the currents are phase-shifted by 180° from one circuit breaker to the other due to the effect of a pure capacitive load, which seems impossible in practice.

The method that has just been described can optionally be applied to the components Bxi, Byi as well for a more accurate field measurement, in particular for applications in which the circuit breakers have a component Bzi that is not clearly higher than the components Bxi and Byi. Similarly, if certain circuit breaker models have a component Bxi or Byi higher than the other two, this component can be used preferentially instead of the component Bzi, if it is not desirable to use the three components. Two components out of three could also be used, instead of only one or all three.

It will be understood by those skilled in the art that various other alternative embodiments of the present invention are possible.

In particular, the existence on the market of circuit breaker models having a point of concentration of the magnetic field located at a point other than near the reset lever, for example on another wall of the circuit breaker, is not excluded. In this case, modules according to the present invention could have a form other than the one shown in the drawings.

Furthermore, a measurement module 30-i according to an embodiment of the present invention can be used alone to measure the current in a single line of an electric network. In this case, the module 30-i may be arranged on a circuit breaker surrounded by other circuit breakers. These other circuit breakers can disturb the measurement made by means of the magnetometer M, by interference effect. In this case, neither the correction method described above nor a correction method by sampling can be implemented since the value of the current traversing the other circuit breakers is not known in real time.

Figure 8:
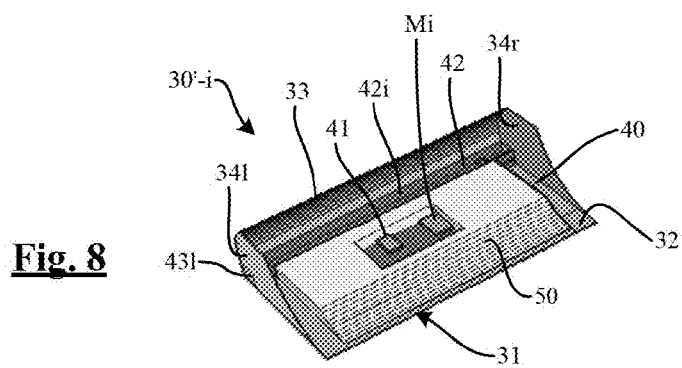
FIG. 8 shows an alternative module for measuring current according to an embodiment of the present invention.

One embodiment 30'-i of the module, represented in FIG. 8, can be used in this case. The module 30'-i differs from the module 30-i in that it includes, around the magnetometer Mi, a magnetic shield 50 made of a metal preferably having good magnetic permeability. The shield 50 surrounds the magnetometer Mi and thus only lets through the component Bzi perpendicular to the base 31 of the module 30'-i, which is emitted by the circuit breaker on which the module 30'-1 is arranged, while blocking the components Bxi and Byi emitted by the other circuit breakers, which propagate parallel to the base 31.

The module 30'-i can also be used to produce the device 50 shown in FIG. 4. In this case, the interference phenomenon is greatly attenuated thanks to the shield that each module includes. It may therefore no longer be necessary to calculate corrected components CBzi, as the components Bzi can be used by the circuit MCT without correction after removal of the DC offset of the terrestrial magnetic field. In one alternative, the provision of the magnetic shield and the method for correcting the components Bzi are combined for an even more accurate measurement.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A method for measuring current in an electrical network, comprising at least one first electric line and at least one second electric line, the method comprising:
    linking the first electric line to a first circuit breaker comprising a first protection coil and having a wall traversed by a magnetic field emitted by the first coil;
    linking the second electric line to a second circuit breaker comprising a second protection coil having a wall traversed by a magnetic field emitted by the second coil;
    arranging, on the wall of the first circuit breaker, a first synchronous three-axis digital magnetometer (Mi) on a semiconductor chip;
    arranging, on the wall of the second circuit breaker, a second synchronous three-axis digital magnetometer on a semiconductor chip;
    measuring, by way of the first digital magnetometer, at least one component of the magnetic field emitted by the first coil; and
    measuring, by way of the second digital magnetometer, at least one component of the magnetic field emitted by the second coil;
    correcting the components measured by each of the first and second magnetometers by subtracting from each component a fraction of the component measured by the other of the first and second magnetometers, so as to neutralize a phenomenon of magnetic interference between the first and second circuit breakers; and
    determining the value of a current traversing each electric line from the corrected components,
    wherein the correction step comprises determining, for each of the first and second circuit breakers, an interference parameter of one of the first and second circuit breakers on the magnetometer associated with the other of the first and second circuit breakers, representative of a variation in the magnetic field detected by the magnetometer associated with the other of the first and second circuit breakers, when the magnetic field emitted by the one of the first and second circuit breakers varies, and
    wherein the step of determining the interference parameter comprises:
    sampling in a synchronous manner, at two successive times, a component of the magnetic field measured by the first magnetometer and a component of the magnetic field measured by the second magnetometer;
    determining a variation in the first in the first component and a variation in the second component; and determining the interference parameter of the one of the first and second circuit breakers on the magnetometer associated with the other of the first and second circuit breakers by dividing the smallest of the two variations in absolute value by the highest of the two variations in absolute value.

2. The method according to claim 1, further comprising arranging magnetic shields around each of the first and second magnetometers to limit the influence on the respective magnetometers of a magnetic field emitted by a neighboring circuit breaker.

3. The method according to claim 1, further comprising:
determining an interference matrix including all the interference parameters;
determining an inverse matrix of the interference matrix; and
correcting the components measured from the inverse interference matrix.

4. The method according to claim 1, further comprising calibrating each magnetometer to associate a value of current circulating in the corresponding electric line with a measured alternating magnetic field value.

5. The method according to claim 1, wherein the measurement of a component of a magnetic field emitted by the coil of a circuit breaker comprises removing a DC offset of terrestrial magnetic field.

6. The method according to claim 1, wherein the first and second electric lines are branch electric lines respectively connected to the first and second circuit breakers.

7. A device for measuring current in an electrical network, the device comprising:
at least one first circuit breaker linked to a first electric line, comprising a first protection coil and having a wall traversed by a magnetic field emitted by the first coil;
at least one second circuit breaker linked to a second electric line, comprising a second protection coil and having a wall traversed by a magnetic field emitted by the second coil;
a first synchronous three-axis digital magnetometer on a semiconductor chip, arranged on the wall of the first circuit breaker; and
a second synchronous three-axis digital magnetometer on a semiconductor chip, arranged on the wall of the second circuit breaker;
a monitoring and processing circuit configured to measure, by way of the first and second magnetometers, at least one component of the magnetic field emitted by each of the first and second coils, to correct the components measured by each of the first and second magnetometers by subtracting from each component a fraction of the component measured by the other of the first and second magnetometers, so as to neutralize a phenomenon of magnetic interference between the first and second circuit breakers, and to determine the value of a current traversing each electric line from the corrected components,
wherein the monitoring and processing circuit is further configured to determine, for each of the first and second circuit breakers, an interference parameter of one of the first and second circuit breakers on the magnetometer associated with the other of the first and second circuit breakers, representative of a variation in the magnetic field detected by the magnetometer associated with the other of the first and second circuit breakers, when the magnetic field emitted by the one of the first and second circuit breakers varies, and
wherein the monitoring and processing circuit is further configured to:
sample in a synchronous manner, at two successive times, a component of the magnetic field measured by the first magnetometer and a component of the magnetic field measured by the second magnetometer;
determine a variation in the first component and a variation in the second component; and
determine the interference parameter of the one of the first and second circuit breakers on the magnetometer associated with the other of the first and second circuit breakers by dividing the smallest of the two variations in absolute value by the highest of the two variations in absolute value.

8. The device according to claim 7, further comprising a magnetic shield arranged around each of the first and second magnetometers to limit the influence on the respective magnetometer of a magnetic field emitted by a neighboring circuit breaker.

9. The measuring device according to claim 7, further comprising a measurement modules, each comprising a housing configured to be arranged on the wall of a circuit breaker, an interconnect carrier receiving a magnetometer, and an apparatus configured to be arranged on the wall of a circuit breaker, an interconnect carrier receiving a magnetometer, and an apparatus configured to electrically couple the magnetometer to at least one other magnetometer arranged in another measurement module.

10. A system for managing current consumption in an electric network comprising electric lines, the system comprising a measuring device according to claim 7, and a remote management device configured to store values of currents supplied by the measuring device.

11. The measuring device according to claim 7, wherein the first and second electric lines are branch electric lines respectively connected to the first and second circuit breakers.

* * * * *